(12) United States Patent
Yu

(10) Patent No.: US 6,494,597 B1
(45) Date of Patent: Dec. 17, 2002

(54) BOWL ON LEAD FRAME IN LIGHT EMITTING DIODE

(76) Inventor: San-Hua Yu, 3F, No. 117, Yan-Shou Road, Tu Cheng, Taipei Hsien (TW)

( * ) Notice: Subject to any disclaimer, the term of this patent is extended or adjusted under 35 U.S.C. 154(b) by 0 days.

(21) Appl. No.: 09/563,410

(22) Filed: May 3, 2000

(30) Foreign Application Priority Data

Oct. 26, 1999 (TW) .......................................... 88218138

(51) Int. Cl.⁷ ............................ F21V 7/04; H01L 33/00
(52) U.S. Cl. ...................... 362/350; 362/296; 362/347; 362/800; 257/99; 257/676
(58) Field of Search .......................... 257/98, 99, 100, 257/676; 313/113, 498, 512; 362/241, 247, 296, 347, 800, 350, 349, 230, 231

(56) References Cited

U.S. PATENT DOCUMENTS

| | | | |
|---|---|---|---|
| 4,920,404 A | * | 4/1990 | Shrimali et al. ............... 257/98 |
| 5,001,609 A | * | 3/1991 | Gardner et al. ............. 362/347 |
| 5,221,641 A | * | 6/1993 | Kurita et al. ................ 313/498 |
| 5,271,077 A | * | 12/1993 | Brockman et al. ........... 362/347 |
| 5,606,181 A | * | 2/1997 | Sakuma et al. ................ 257/98 |
| 5,623,181 A | * | 4/1997 | Suehiro et al. ............. 313/512 |
| 5,673,995 A | * | 10/1997 | Segaud ........................ 362/800 |
| 5,704,709 A | * | 1/1998 | Zwick et al. ................ 362/241 |
| 6,106,137 A | * | 8/2000 | Adams et al. ............... 362/241 |
| 6,200,002 B1 | * | 3/2001 | Marshall et al. ............ 362/296 |

FOREIGN PATENT DOCUMENTS

| | | | | | |
|---|---|---|---|---|---|
| JP | 62073786 A | * | 4/1987 | .................. | 257/99 |
| JP | 363133684 A | * | 6/1998 | .................. | 257/98 |

* cited by examiner

Primary Examiner—Alan Cariaso
(74) Attorney, Agent, or Firm—Troxell Law Office PLLC

(57) ABSTRACT

A bowl for a lead frame in a light emitting diode has a room with inner wall and the inner wall has a curved surface concave toward the center of the room. The light emitted can be concentrated as a beam of light by way of being reflected by the curved surface.

1 Claim, 2 Drawing Sheets

BOWL ON LEAD FRAME IN LIGHT EMITTING DIODE

BACKGROUND OF THE INVENTION

1. Field of The Invention

The present invention relates to a bowl on a lead frame in a light emitting diode, and particularly to a bowl on a lead frame in a light emitting diode to prevent the light from divergence or diffusion.

2. Description of Related Art

The diode is a kind of electronic element and has been used for years. Especially, the light emitting diode provides a feature of flashing such that it is frequently used for signaling or decorating. Because of the feature of flashing, the light emitting diode consumes less electricity so that a little bit power is enough for supplying the electricity needed by the light emitting diode. Therefore, the light emitting diode is widely adopted in the traffic indication rod, the third brake light on a car, Christmas decoration lights, and other light emitting device.

Usually the light emitting diode is made by the following steps: a conductive metal band is stamped to form semi-products and each semi-product has a couple of connecting legs, then, a dies or a chip is brazed to one of the connecting legs at the bowl thereon, the bowl connects the other connecting leg with a brazing line, and finally, the other end of each connecting leg is cut to constitute a long connecting leg and a short connecting leg. Generally, the long leg is used as a negative pole and the short leg is a positive pole. After the dies is placed in the bowl, the dies is sealed in place by glue. The long and the short legs are frame body such that they are called blank material or so called lead frames of the light emitting diode.

As mentioned above, in order to locate the dies, one of the lead frame at an end thereof is a bowl such that the dies can be brazed to the bowl and the bowl is sealed up by glue to perform the function of emitting light. However, divergence or diffusion will be generated while the light is emitted from the dies. Therefore, a poor light intensity is obtained undesirably.

SUMMARY OF THE INVENTION

An object of the present invention is to provide a bowl for a lead frame in a light emitting diode, with which a divergency of light or a diffusion of light can be overcome completely.

BRIEF DESCRIPTION OF THE DRAWINGS

The present invention can be more fully understood by referring to the following description and accompanying drawing, in which.

DETAILED DESCRIPTION OF THE PREFERRED EMBODIMENTS

Figure 1:
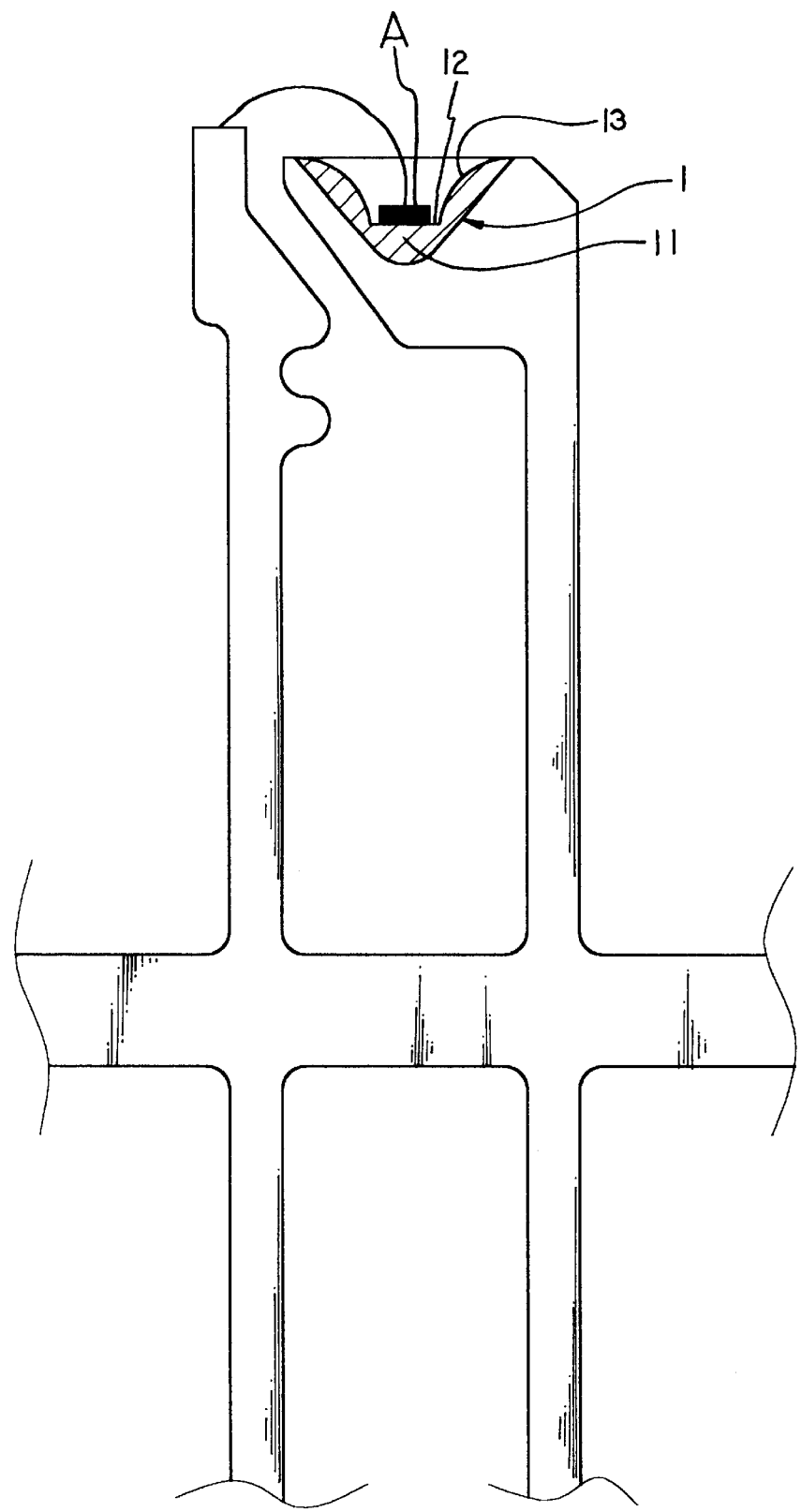
FIG. 1 is a plan view of a bowl for a lead frame in a light emitting diode of the present invention.

Referring to FIG. 1, a bowl 1 for a dies is provided on one of the lead frames at an end thereof and the bowl 1 has a conical space with an opening upward. A bowl bottom 11 of the bowl 1 has a flat surface 12 for locating the dies A.

Unlike the prior art, a conical wall of the bowl 1 is provided with a curved convex surface 13 facing toward the center of the space in the bowl such that the space forms a trumpet room.

Referring to FIG. 1 again, after having been placed and located in the bowl 1, the light emitted by the dies A is reflected by the curved surface 13 to constitute a gathered beam of light. Thus, the light emitted is concentrated to increase the light intensity accordingly.

Figure 2:
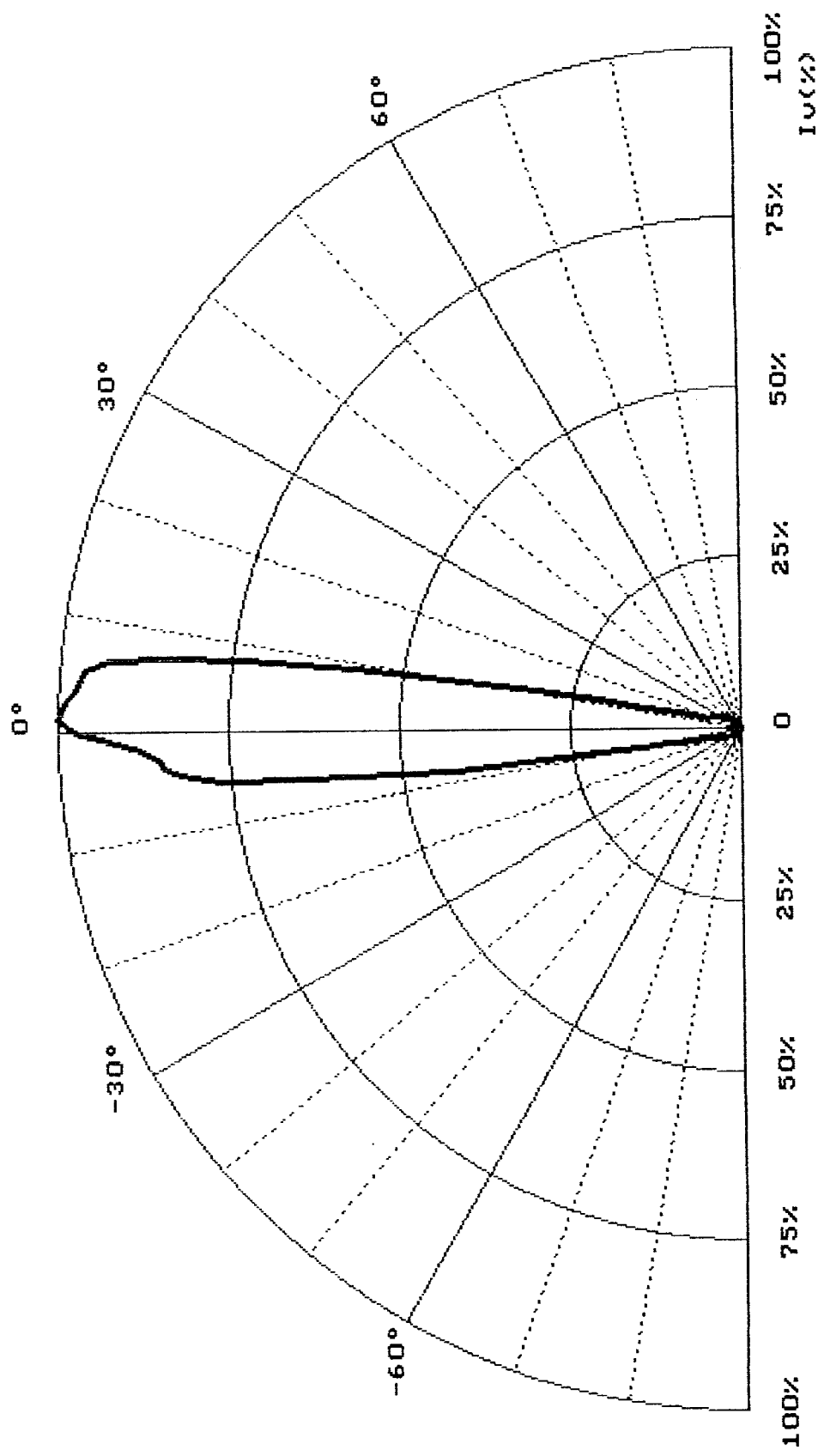
FIG. 2 is a diagram of distribution for a measured light.

Referring to FIG. 2, a graph of the light intensity is measured from the light emitted via the bowl of the present invention. It can be seen that the graph is gathered at the vertical region and it means the light is concentrated at the central part while is emits out. Hence, it can be verified that a dies A is located in the bowl of the present invention will generate a best illumination. It is quite clearly that the superior result made by the bowl of the present invention is not possible for the prior art being able to achieve.

In addition, if a ellipsoid bowl is used instead of the cone bowl and the inner wall of the ellipsoid bowl is provided with curved surface as the cone bowl does, a concentrated light beam can be obtained as well to intensify the light. Because this is an equivalent effect, a detail will not described further.

While the invention has been described with reference to a preferred embodiment thereof, it is to, be understood that modifications or variations may be easily made without departing from the spirit of this invention, which is defined by the appended claims.

What is claimed is:

1. A lead frame for a light emitting diode comprising:
   a) an end of the lead frame having a recessed, generally conical bowl with a flat bottom and a convexly curved side surface; and,
   b) an LED die mounted on the flat bottom of the bowl, a height of an upper surface of the die above the flat bottom being substantially less than a height of an uppermost portion of the convexly curved side surface above the flat bottom surface, whereby light from the LED die reflected by the convexly curved side surface has an included angle of no more than 20°.

* * * * *